(12) United States Patent
Lin et al.

(10) Patent No.: US 12,283,481 B2
(45) Date of Patent: Apr. 22, 2025

(54) METHOD FOR MANUFACTURING SEMICONDUCTOR DEVICE

(71) Applicant: United Microelectronics Corp., Hsinchu (TW)

(72) Inventors: Yu Cheng Lin, Tainan (TW); Wei-Chuang Lai, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 130 days.

(21) Appl. No.: 17/353,547

(22) Filed: Jun. 21, 2021

(65) Prior Publication Data

US 2022/0367182 A1   Nov. 17, 2022

(30) Foreign Application Priority Data

May 14, 2021   (CN) .......................... 202110527033.1

(51) Int. Cl.
*H01L 21/02* (2006.01)
*H01L 21/3105* (2006.01)
*H01L 21/768* (2006.01)
*H01L 23/00* (2006.01)

(52) U.S. Cl.
CPC .. *H01L 21/02315* (2013.01); *H01L 21/02065* (2013.01); *H01L 21/022* (2013.01); *H01L 21/02301* (2013.01); *H01L 21/31053* (2013.01); *H01L 21/76819* (2013.01); *H01L 21/0214* (2013.01); *H01L 21/02164* (2013.01); *H01L 21/02167* (2013.01); *H01L 21/0217* (2013.01); *H01L 21/76826* (2013.01); *H01L 21/76832* (2013.01); *H01L 21/76835* (2013.01); *H01L 21/7684* (2013.01); *H01L 24/29* (2013.01); *H01L 24/32* (2013.01); *H01L 24/83* (2013.01); *H01L 24/94* (2013.01); *H01L 2224/29186* (2013.01); *H01L 2224/32145* (2013.01); *H01L 2224/83193* (2013.01); *H01L 2224/83896* (2013.01); *H01L 2224/94* (2013.01)

(58) Field of Classification Search
CPC ......... H01L 21/02315; H01L 21/02065; H01L 21/022; H01L 21/02301; H01L 21/31053; H01L 21/76819; H01L 21/0214; H01L 21/02164; H01L 21/02167; H01L 21/0217; H01L 24/29; H01L 24/32; H01L 24/83; H01L 2224/29186; H01L 2224/32145; H01L 2224/83896; H01L 24/94; H01L 2224/83193; H01L 2224/94; H01L 21/76826; H01L 21/76832; H01L 21/76834; H01L 21/76835; H01L 21/7684
See application file for complete search history.

(56) References Cited

U.S. PATENT DOCUMENTS 6,096,662 A   8/2000   Ngo et al.
6,153,512 A   11/2000   Chang et al.
(Continued)

*Primary Examiner* — Shaun M Campbell
*Assistant Examiner* — Aneta B Cieslewicz
(74) *Attorney, Agent, or Firm* — J.C. PATENTS

(57) ABSTRACT

A method for manufacturing a semiconductor device is provided. The method includes a step of performing a chemical mechanical polishing process on a first silicon oxide layer to form a planar surface layer; surface treatment is performed on the planar surface layer to form a treated planarization layer, and a second silicon oxide layer is formed on the treated planarization layer.

7 Claims, 6 Drawing Sheets

(56) References Cited

U.S. PATENT DOCUMENTS

| | | | |
|---|---|---|---|
| 6,225,210 B1* | 5/2001 | Ngo | H01L 21/0217 |
| | | | 257/E21.585 |
| 6,521,300 B1 | 2/2003 | Hsieh et al. | |
| 2002/0106891 A1* | 8/2002 | Kim | H01L 21/02362 |
| | | | 438/786 |
| 2004/0226918 A1* | 11/2004 | Lee | C09G 1/02 |
| | | | 216/89 |
| 2005/0062164 A1* | 3/2005 | Lin | H01L 21/76834 |
| | | | 257/E21.293 |
| 2006/0278954 A1* | 12/2006 | Izumi | C23C 16/401 |
| | | | 257/532 |
| 2008/0197502 A1* | 8/2008 | Kikuchi | H01L 23/53295 |
| | | | 257/E23.141 |
| 2017/0301646 A1* | 10/2017 | Kim | H01L 25/0657 |
| 2019/0139757 A1* | 5/2019 | Peng | H01L 21/02216 |
| 2022/0223465 A1* | 7/2022 | Huang | H01L 23/53295 |

\* cited by examiner

METHOD FOR MANUFACTURING SEMICONDUCTOR DEVICE

CROSS-REFERENCE TO RELATED APPLICATION

This application claims the priority benefit of China application no. 202110527033.1, filed on May 14, 2021. The entirety of the above-mentioned patent application is hereby incorporated by reference herein and made a part of this specification.

BACKGROUND

Technical Field

The disclosure relates to a method for manufacturing an integrated circuit; more particularly, the disclosure relates to a method for manufacturing a semiconductor device.

Description of Related Art

A chemical mechanical polishing process is a crucial planarization technology in a semiconductor manufacturing process. However, after a dielectric layer is planarized, poor adhesion between the dielectric layer and the overlying layer often leads to issues of film cracking or delamination.

SUMMARY

The disclosure provides a method for manufacturing a semiconductor device, which may improve adhesion between a planar surface layer planarized by performing a chemical mechanical polishing process and an overlying layer and may resolve an issue of film cracking or delamination.

According to an embodiment of the disclosure, a method for manufacturing a semiconductor device is provided, and the method include performing a chemical mechanical polishing process on a first silicon oxide layer to form a planar surface layer; surface treatment is performed on the planar surface layer to form a treated planarization layer, and a second silicon oxide layer is formed on the treated planarization layer.

In an embodiment of the disclosure, the surface treatment includes oxygen plasma treatment, hydrogen plasma treatment, or $NH_3$ plasma treatment.

In an embodiment of the disclosure, the step of performing the surface treatment on the planar surface layer and the step of forming the second silicon oxide layer on the treated planarization layer are performed in an in-situ manner.

In an embodiment of the disclosure, the step of performing the surface treatment on the planar surface layer and the step of forming the second silicon oxide layer on the treated planarization layer are performed in an ex-situ manner.

According to another embodiment of the disclosure, a method for manufacturing a semiconductor device is provided, and the method includes forming an interconnection structure on the first substrate; a first material layer is formed on the interconnection structure, a first dielectric layer is formed on the first material layer, a planarization process is performed on the first dielectric layer to form a planar surface layer, first surface treatment is performed on the planar surface layer to form a treated planarization layer, and a second dielectric layer is formed on the treated planarization layer. Here, the first substrate, the interconnection structure, the first material layer, the first dielectric layer, the treated planarization layer, and the second dielectric layer form a first semiconductor wafer. A second semiconductor wafer is bonded to the first semiconductor wafer.

In an embodiment of the disclosure, the planarization process includes a chemical mechanical polishing process performed by applying an $NH_3$-rich slurry containing tetramethyl ammonium hydroxide (TMAH).

In an embodiment of the disclosure, the first surface treatment includes oxygen plasma treatment, hydrogen plasma treatment, or $NH_3$ plasma treatment.

In an embodiment of the disclosure, the method for manufacturing of the semiconductor device further includes performing second surface treatment on the interconnection structure before forming the first material layer on the interconnection structure.

In an embodiment of the disclosure, the second surface treatment includes the hydrogen plasma treatment.

In an embodiment of the disclosure, a step of bonding a second substrate to the first substrate includes bonding a second material layer on the second substrate to the second dielectric layer on the first substrate.

In an embodiment of the disclosure, the first dielectric layer and the second dielectric layer include a silicon oxide layer, and the first material layer and the second material layer include a silicon carbonitride layer.

In an embodiment of the disclosure, the step of performing the first surface treatment on the planar surface layer and the step of forming the second silicon oxide layer on the treated planarization layer are performed in an in-situ manner.

In an embodiment of the disclosure, the step of performing the first surface treatment on the planar surface layer and the step of forming the second silicon oxide layer on the treated planarization layer are performed in an ex-situ manner.

In light of the foregoing, in the method for manufacturing of the semiconductor device as provided in one or more embodiments of the disclosure, the adhesion between the planar surface layer planarized by performing the chemical mechanical polishing process and the overlying layer may be improved, and the issue of delamination may be prevented.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
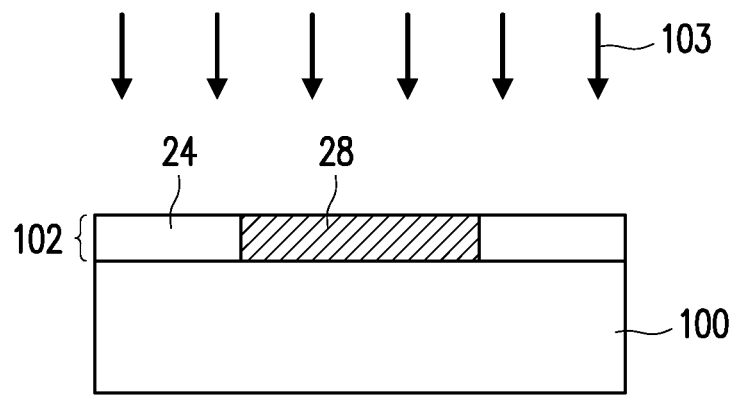
FIG. 1A to FIG. 1H are schematic cross-sectional views of a method for manufacturing a semiconductor device according to an embodiment of the disclosure.

Reference will now be made in detail to the embodiments provided in the disclosure, examples of which are illustrated in the accompanying drawings. Wherever possible, the same reference numbers are used in the drawings and the description to refer to the same or like parts.

Figure 2:
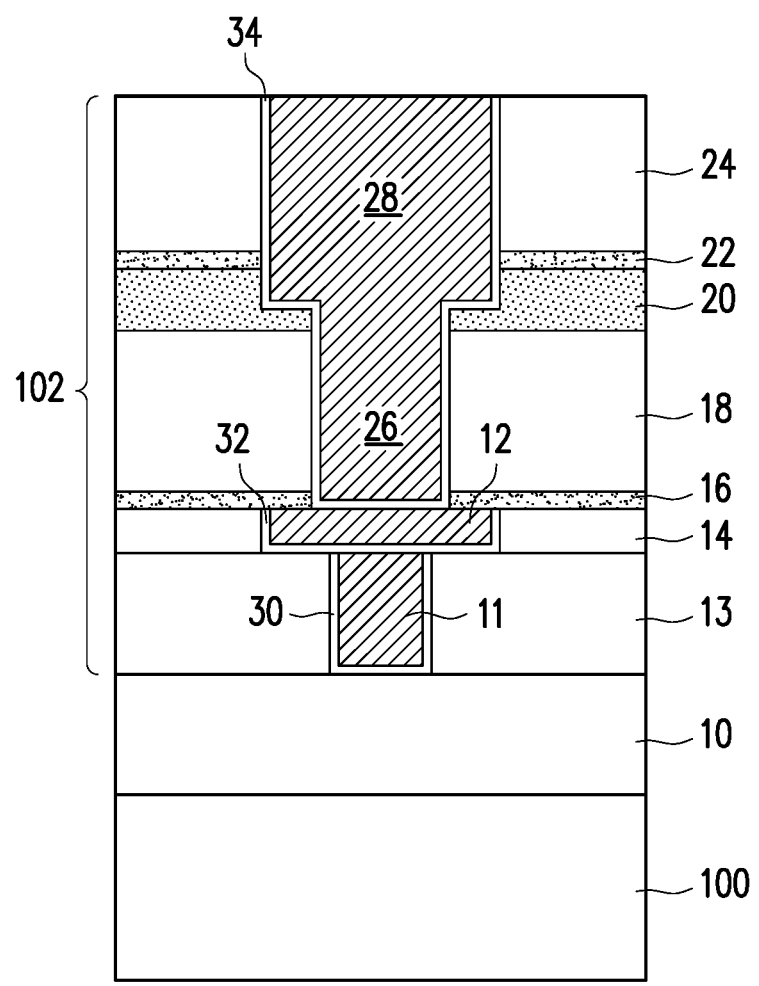
FIG. 2 is a schematic partial cross-sectional view of a semiconductor device according to an embodiment of the disclosure.

With reference to FIG. 1A and FIG. 2, a substrate 100 is provided. The substrate 100 may be a doped silicon substrate, an undoped silicon substrate, a silicon-on-insulator (SOI) substrate, or an epitaxial substrate. The dopant of the doped silicon may be a p-type dopant, an n-type dopant, or a combination thereof. An isolation structure (not shown) may be further formed in the substrate 100 to define the active region in the substrate 100. A device layer 10 may be formed on the substrate 100 or in the substrate 100. The device layer 10 may include an active device or a passive device. The active device is, for instance, a p-type metal oxide semiconductor (PMOS), an n-type metal oxide semiconductor (NMOS), a complementary metal oxide semiconductor (CMOS), a junction field effect transistor (JFET), a bipolar junction transistor (BJT), a diode, or the like. The passive device is, for instance, an inductor, a capacitor, and so on.

With reference to FIG. 1A and FIG. 2, an interconnection structure 102 is formed on the substrate 100. The interconnection structure 102 includes an inner dielectric layer 13, a contact window 11, a conductive wire 12, an etch-stop layer 16, inter-layer dielectric layers 14, 18, and 24, a via 26, a topmost conductive wire 28, hard mask layers 20 and 22, and other components. In some embodiments, other conductive wires, inter-layer dielectric layers and vias may be further arranged between the conductive wire 12 and the contact window 11, which is however not shown in the drawings. The contact window 11, the conductive wires 12 and 28, and the via 26 may be electrically connected to each other and electrically connected to devices in the device layer 10. A material of the conductive wires 12 and 28 and the via 26 includes doped polysilicon or metal. The metal is, for instance, copper, tungsten, copper-aluminum alloy, or the like. In some embodiments, the conductive wires 12 and 28 and the vias 11 and 26 may further include barrier layers 30, 32, and 34. The conductive wire 28 and the via 26 may be formed by a dual damascene process, which should however not be construed as a limitation in the disclosure. The inner dielectric layer 13 and the inter-layer dielectric layers 14, 18, and 24 may be made of silicon oxide (SiO), for instance, and a method of forming the same is, for instance, a chemical vapor deposition method, a spin coating method, or the like. In some embodiments, the inter-layer dielectric layers 14 and 18 may be made of a material with a dielectric constant lower than 4. The inner dielectric layer 13 and the inter-layer dielectric layers 14, 18, and 24 may be planarized by performing a chemical mechanical polishing process or an etch-back process. The etch-stop layer 16 is, for instance, made of silicon nitride (SiN) or silicon oxynitride (SiON). The hard mask layer 20 is, for instance, made of silicon oxynitride. The hard mask layer 22 is, for instance, made of SiN. The etch-stop layer 16 and the hard mask layers 20 and 20 may be formed by chemical vapor deposition.

For brief and concise illustration, the device layer 10 is omitted in FIG. 1A to FIG. 1H, and some components of the interconnection structure 102 are omitted as well. The topmost conductive wire 28 of the interconnection structure 102 and the inter-layer dielectric layer 24 are shown in FIG. 1A to FIG. 1H.

Figure 1B:
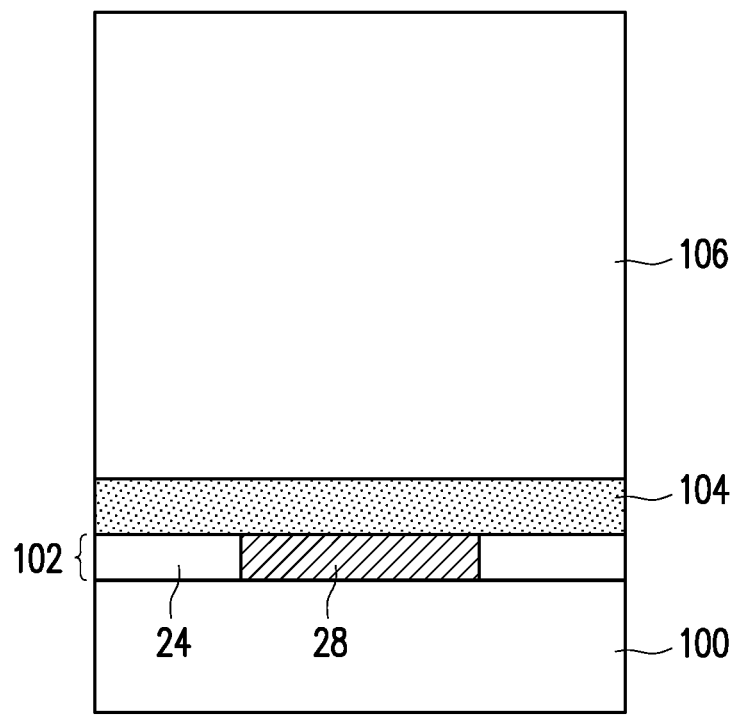

With reference to FIG. 1B, surface treatment 103 is performed on the interconnection structure 102. Through the surface treatment 103, oxides (e.g., copper oxide or impurities) on the surface of the topmost conductive wire 28 may be removed. A gas applied in the surface treatment 103 includes hydrogen. The surface treatment 103 may be performed in a deposition machine or an etching machine. In an embodiment of the disclosure, the surface treatment 103 is performed in a machine containing plasma, such as a plasma enhancement chemical vapor deposition machine. In an exemplary embodiment, hydrogen serves as the gas source for the plasma, the gas flow rate is 200 sccm to 500 sccm, the temperature is 350° C. to 450° C., the pressure is 4 torrs to 7 torrs, and the reaction time is 5 seconds to 30 seconds.

With reference to FIG. 1B, a material layer 104 is formed on the interconnection structure 102. The material layer 104 includes a dielectric material, such as silicon carbonitride (SiCN), SiN, or SiON. The material layer 104 may be composed of one single layer or multiple layers. A method of forming the material layer 104 is, for instance, a plasma enhancement chemical vapor deposition method. The step of forming the material layer 104 and the step of performing the surface treatment 103 may be performed in an in-situ manner in the same machine or in an ex-situ manner in different machines. The thickness of the material layer 104 is, for instance, 200 angstroms to 500 angstroms.

A dielectric layer 106 is then formed on the material layer 104. A material of the dielectric layer 106 is different from that of the material layer 104. The dielectric layer 106 may be composed of one single layer or multiple layers. The dielectric layer 106 is, for instance, a silicon oxide layer, such as undoped silicon glass (USG). A method of forming the dielectric layer 106 is, for instance, a plasma enhancement chemical vapor deposition method. The thickness of the dielectric layer 106 is, for instance, 12000 angstroms to 16000 angstroms.

Figure 1C:
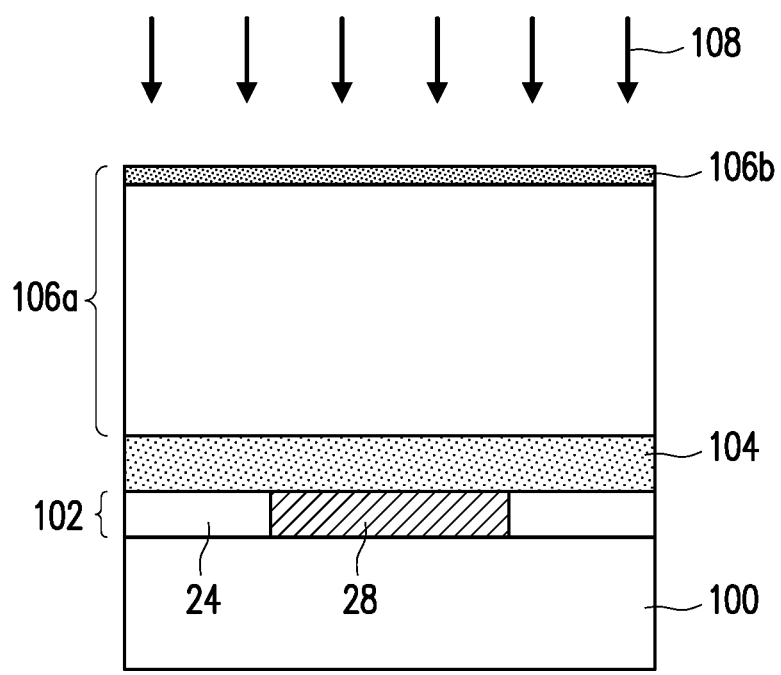
Figure 1D:
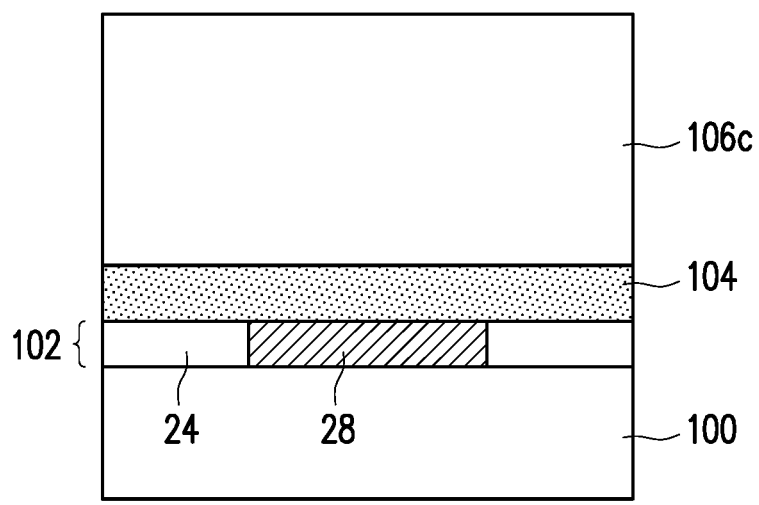

With reference to FIG. 1C, a planarization process is performed on the dielectric layer 106 to form a planar surface layer 106a. In some embodiments, the thickness of the planar surface layer 106a is, for instance, 6500 angstroms to 12500 angstroms. The planarization process is, for instance, a chemical mechanical planarization process. In an embodiment of the disclosure, a $NH_3$-rich slurry containing tetramethyl ammonium hydroxide (TMAH) is applied in the chemical mechanical planarization process. In some cases, the slurries react with the dielectric layer 106, so that nitrogen is adsorbed onto the surface of the planar surface layer 106a; alternatively, the slurries react with the surface of the planar surface layer 106a to form a surface layer 106b. Therefore, the nitrogen content of the surface layer 106b of the planar surface layer 106a is greater than the nitrogen content of the inner layer of the planar surface layer 106a.

The nitrogen content of the surface layer 106b of the planar surface layer 106a is significant; hence, if the nitrogen is not removed, issues of film cracking and delamination may arise after a stacked structure (shown in FIG. 1G) is subsequently formed. Therefore, in an embodiment of the disclosure, after the planarization process is performed, surface treatment 108 is also performed to remove or reduce the nitrogen in the surface layer 106b of the planar surface layer 106a, so as to form a treated planarization layer 106c, as shown in FIG. 1C. The nitrogen content of the surface of the treated planarization layer 106c is lower than the nitrogen content of the surface layer 106b of the planar surface layer 106a.

The surface treatment 108 may be performed in a deposition machine or an etching machine. In an embodiment of the disclosure, the surface treatment 108 is performed in a machine containing plasma, such as a plasma enhancement chemical vapor deposition machine or a plasma etching machine (for instance, a lam machine). In an exemplary embodiment, oxygen, hydrogen, or ammonia serves as the gas source for the plasma, the gas flow rate is 500 sccm to 1000 sccm, the temperature is 350° C. to 450° C., the pressure is 4 torrs to 7 torrs, and the reaction time is 5 seconds to 30 seconds. The surface treatment 108 may be performed in an in-situ manner in a machine which may be subsequently applied to form the dielectric layer 110 (as shown in FIG. 1E) or may be performed in an ex-situ manner in a different machine.

Figure 1E:
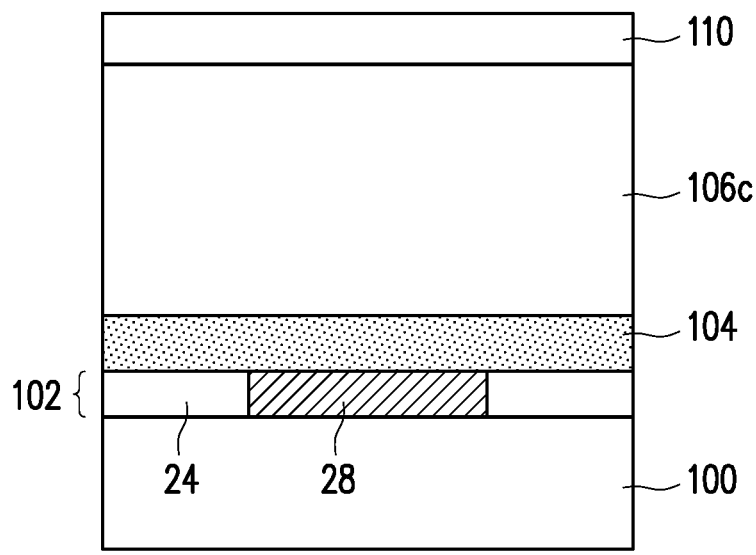

With reference to FIG. 1E, a dielectric layer 110 is formed on the treated planarization layer 106c. The dielectric layer 110 may be composed of one single layer or multiple layers. The dielectric layer 110 is, for instance, a silicon oxide layer, such as USG. The thickness of the dielectric layer 110 is, for instance, 800 angstroms to 1200 angstroms. As mentioned above, the step of forming the dielectric layer 110 and the step of performing the surface treatment 108 may be performed in an in-situ manner in the same machine or performed in an ex-situ manner in different machines.

Figure 1F:
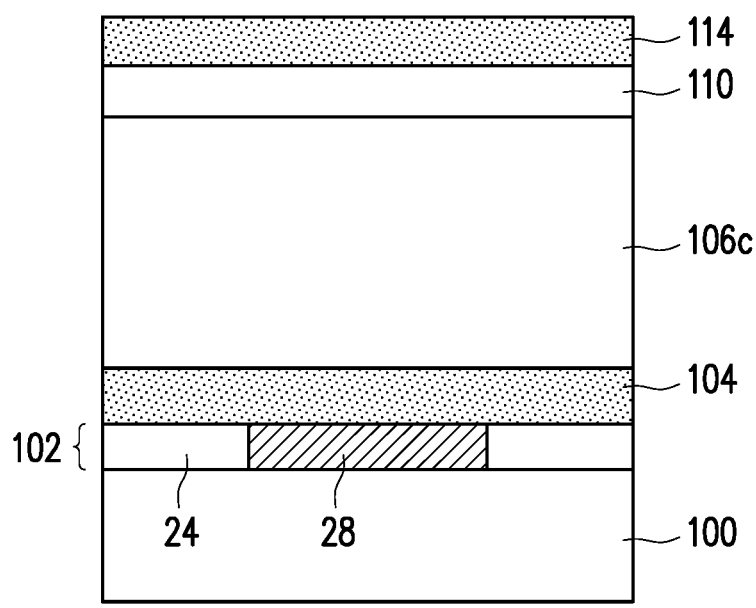

With reference to FIG. 1F, a material layer 114 is formed on the dielectric layer 110. A material of the material layer 114 includes a dielectric material, such as SiCN, SiN, or SiON. The material layer 114 may be composed of one single layer or multiple layers. A method of forming the material layer 114 is, for instance, a plasma enhancement chemical vapor deposition method. The material of the material layer 114 is different from the material of the dielectric layer 110, and the material layer 114 and the material layer 104 are made of the same material or different materials. The thickness of the material layer 114 is, for instance, 200 angstroms to 500 angstroms.

Figure 1G:
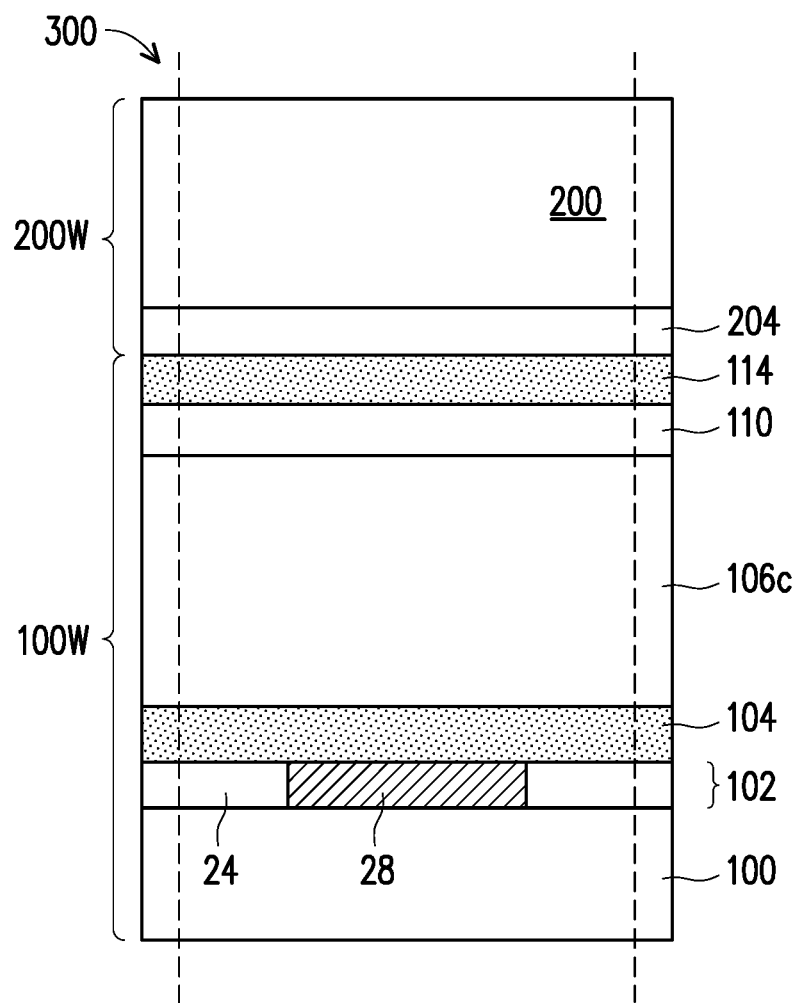

With reference to FIG. 1G, a semiconductor wafer 200 W is then provided. The semiconductor wafer 200 W includes a substrate 200 and a material layer 204. The substrate 200 may be a doped silicon substrate, an undoped silicon substrate, an SOI substrate, or an epitaxial substrate. The dopant of the doped silicon may be a p-type dopant, an n-type dopant, or a combination thereof. An isolation structure (not shown) may also be formed in the substrate 200 to define an active region in the substrate 200. A device layer (not shown) may be formed on or in the substrate 200. The device layer (not shown) may include an active device or a passive device. The active device is, for instance, a PMOS, an NMOS, a CMOS, a JFET, a BJT, a diode, or the like. The passive device is, for instance, an inductor, a capacitor, and so on. The substrate 200 may also include an interconnection structure (not shown). The interconnection structure includes an inner dielectric layer, a contact window, a conductive wire, an etch-stop layer, an inter-layer dielectric layer, a via, a topmost conductive wire, a hard mask layer, and other components.

The semiconductor wafer 200 W also includes a material layer 204 located on the interconnection structure of the substrate 200. A material of the material layer 204 includes a dielectric material, such as SiCN, SiN, SiON, or SiO. The material layer 204 may be composed of one single layer or multiple layers. A method of forming the material layer 204 is, for instance, a chemical vapor deposition method. The material of the material layer 204 may be the same as or different from the material of the material layer 114.

The material layer 204 and the material layer 114 are then bonded and serve as a bonding layer, so as to bond the semiconductor wafer 200 W to the semiconductor wafer 100 W (including the substrate 100, the interconnection structure 102, the dielectric layer 106a, the dielectric layer 110, and the material layer 114) to form a stacked structure 300.

Figure 1H:
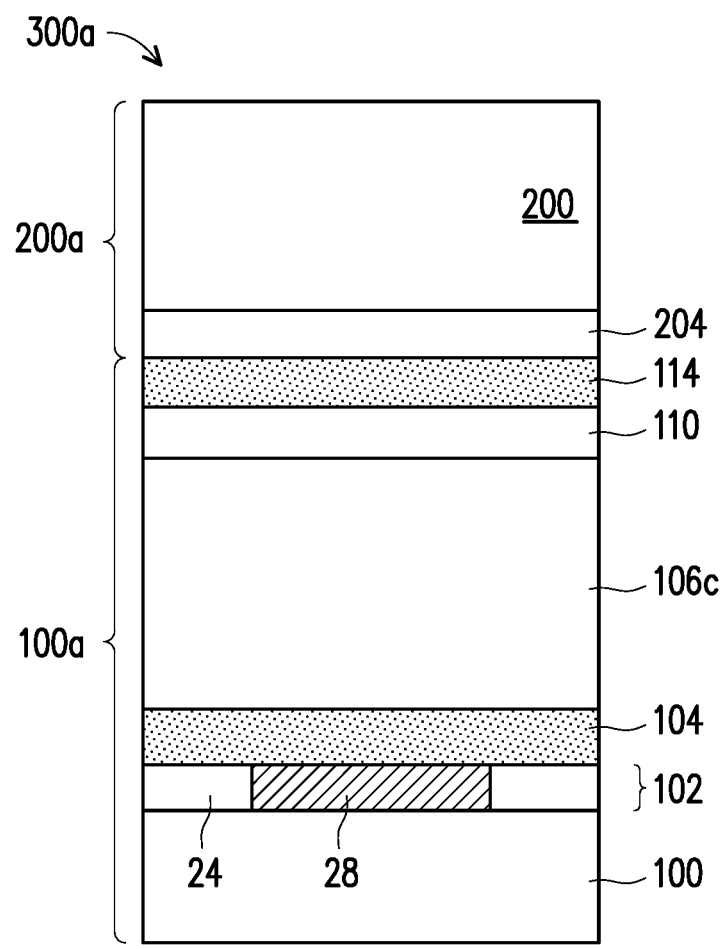

With reference to FIG. 1H, in some embodiments, the stacked structure 300 is further divided into a plurality of stacked dies 300a. The stacked dies 300a include a die 100a and a die 200a. The die 100a is, for instance, a logic die, and the die 200a is, for instance, a sensing die or a memory die.

The previous embodiments serve to explain a wafer-to-wafer structure, which should not be construed as a limitation in the disclosure. The embodiments of the disclosure may also serve to explain a die-to-wafer structure.

To sum up, in the method for manufacturing the semiconductor device according to one or more embodiments of the disclosure, after planarization is performed through performing the chemical mechanical polishing process, the surface treatment is performed on the planar surface layer, which may enhance the adhesion between the treated planarization layer and the overlying dielectric layer and resolve the issue of film cracking or delamination.

It will be apparent to those skilled in the art that various modifications and variations can be made to the disclosed embodiment without departing from the scope or spirit of the disclosure. In view of the foregoing, it is intended that the disclosure covers modifications and variations provided that they fall within the scope of the following claims and their equivalents.

What is claimed is:

1. A method for manufacturing a semiconductor device, the method comprising:
   forming an interconnection structure on a first substrate;
   performing first surface treatment on a topmost conductive wire of the interconnection structure;
   forming a first material layer on the topmost conductive wire of the interconnection structure;
   forming a first dielectric layer on the first material layer;
   performing a planarization process on the first dielectric layer to form a planar surface layer;
   performing second surface treatment on the planar surface layer to form a treated planarization layer;
   forming a first bonding layer over the treated planarization layer and over the topmost conductive wire, wherein the first substrate, the interconnection structure, the first material layer, the first dielectric layer, the treated planarization layer, and the first bonding layer form a first semiconductor wafer; and
   bonding a second bonding layer of a second semiconductor wafer to the first bonding layer over the treated planarization layer of the first semiconductor wafer,
   wherein the second surface treatment comprises oxygen plasma treatment, or hydrogen plasma treatment,
   wherein a nitrogen content of a surface layer of the treated planarization layer is lower than a nitrogen content of a surface layer of the planar surface layer.

2. The method for manufacturing of the semiconductor device according to claim 1, wherein the planarization process comprises performing a chemical mechanical polishing process by applying a $NH_3$-rich slurry containing tetramethyl ammonium hydroxide.

3. The method for manufacturing of the semiconductor device according to claim 2, wherein the step of performing the first surface treatment on the interconnection structure is before the step of forming the first material layer on the interconnection structure.

4. The method for manufacturing of the semiconductor device according to claim 1, further comprising:
   forming a second dielectric layer between the first bonding layer and the treated planarization layer.

5. The method for manufacturing of the semiconductor device according to claim 4, wherein the first dielectric layer and the second dielectric layer comprise a silicon oxide layer, and the first bonding layer and the second bonding layer comprise a silicon carbonitride layer.

6. The method for manufacturing of the semiconductor device according to claim 1, wherein the step of performing the second surface treatment on the planar surface layer and the step of forming the first bonding layer on the treated planarization layer are performed in an in-situ manner.

7. The method for manufacturing of the semiconductor device according to claim 1, wherein the step of performing the second surface treatment on the planar surface layer and the step of forming the first bonding layer on the treated planarization layer are performed in an ex-situ manner.

* * * * *